United States Patent
Hsu

(10) Patent No.: US 10,781,850 B2
(45) Date of Patent: Sep. 22, 2020

(54) SUPPORTING DEVICE, HINGE MODULE, AND JOINT ASSEMBLY

(71) Applicant: FOSITEK CORPORATION, New Taipei (TW)

(72) Inventor: An-Szu Hsu, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 102 days.

(21) Appl. No.: 16/138,332

(22) Filed: Sep. 21, 2018

(65) Prior Publication Data

US 2019/0145457 A1   May 16, 2019

(30) Foreign Application Priority Data

Nov. 13, 2017   (TW) .............................. 106139154 A

(51) Int. Cl.
| | |
|---|---|
| *E05D 3/06* | (2006.01) |
| *F16C 11/04* | (2006.01) |
| *H05K 5/02* | (2006.01) |
| *E05D 11/00* | (2006.01) |

(52) U.S. Cl.
CPC .............. *F16C 11/04* (2013.01); *E05D 3/06* (2013.01); *E05D 11/00* (2013.01); *E05Y 2900/60* (2013.01); *E05Y 2900/606* (2013.01); *H05K 5/0226* (2013.01)

(58) Field of Classification Search
CPC ........ G06F 1/16; G06F 1/1681; G06F 1/1616; H04M 1/022; H05K 5/0226; F16C 11/04; E05D 3/06; E05D 3/12; E05D 3/14; E05D 3/18; Y10T 403/32008; Y10T 403/32016
See application file for complete search history.

(56) References Cited

U.S. PATENT DOCUMENTS

| | | | | |
|---|---|---|---|---|
| 9,874,048 B1* | 1/2018 | Hsu | ..................... | E05D 11/1028 |
| 9,874,906 B1* | 1/2018 | Hsu | ..................... | G06F 1/1681 |
| 10,070,546 B1* | 9/2018 | Hsu | ........................... | E05D 3/06 |
| 10,480,225 B1* | 11/2019 | Hsu | ..................... | G06F 1/1616 |
| 10,564,682 B1* | 2/2020 | Wu | ..................... | G06F 1/1681 |

(Continued)

FOREIGN PATENT DOCUMENTS

| | | |
|---|---|---|
| CN | 205780260 U | 12/2016 |
| TW | M537374 U | 2/2017 |
| TW | I597008 B | 8/2017 |

*Primary Examiner* — Emily M Morgan
(74) *Attorney, Agent, or Firm* — Li & Cai Intellectual Property (USA) Office

(57) ABSTRACT

A hinge module includes a joint assembly, a first pivot, and a second pivot. The joint assembly includes a first joint washer, a second joint washer separate from and coplanar with the first joint washer, an interlock member having two elongated limiting holes, and two pins. The first joint washer has a first pivot hole and a first pin hole. The second joint washer has a second pivot hole and a second pin hole. The pins are respectively inserted into the first and second pin holes and movably pass through the limiting holes. The first and second pivots respectively pass through the first and second pivot holes. When the first joint washer is rotated around the first pivot, the corresponding pin moves the interlock member in a direction perpendicular to each limiting hole, thereby moving the other pin to rotate the second joint washer around the second pivot.

9 Claims, 12 Drawing Sheets

(56) References Cited

U.S. PATENT DOCUMENTS

| | | | |
|---|---|---|---|
| 2010/0071155 A1* | 3/2010 | Ueyama | G06F 1/1616 16/250 |
| 2010/0149764 A1* | 6/2010 | Ueyama | G06F 1/1681 361/749 |
| 2015/0013107 A1* | 1/2015 | Shin | E05D 3/06 16/366 |
| 2015/0245511 A1* | 8/2015 | Hsu | H04M 1/022 74/63 |
| 2016/0123054 A1* | 5/2016 | Senatori | E05D 3/12 361/679.27 |
| 2018/0049329 A1* | 2/2018 | Seo | E05D 11/1078 |
| 2019/0145457 A1* | 5/2019 | Hsu | F16C 11/04 16/368 |

\* cited by examiner

SUPPORTING DEVICE, HINGE MODULE, AND JOINT ASSEMBLY

CROSS-REFERENCE TO RELATED PATENT APPLICATION

This application claims the benefit of priority to Taiwan Patent Application No. 106139154, filed on Nov. 13, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND OF THE INVENTION

1. Field of the Invention

The present disclosure relates to a supporting device; in particular, to a supporting device, a hinge module, and a joint assembly each having components which can operate in synchronization with each other.

2. Description of Related Art

A conventional hinge module is operated by two sets of stacked sheet-like gears engaged with each other, such that a large number of gears are required in production of the conventional hinge module, which complicates the manufacture process thereof. Moreover, since the force transmission of the conventional hinge module is achieved by using the two sets of sheet-like gears, and the teeth of each sheet-like gear has a specific size that is not easily reduced, a distance between two pivots respectively inserted into the two sets of sheet-like gears is limited by the structure of the sheet-like gears and is difficult to be adjusted or changed.

SUMMARY OF THE INVENTION

The present disclosure provides a supporting device, a hinge module, and a joint assembly to solve the drawbacks associated with conventional hinge modules.

The present disclosure discloses a supporting device, which includes a hinge module and at least one buffering module. The hinge module includes at least one joint assembly, a first pivot, and at least one second pivot. The at least one joint assembly includes a first joint washer, a second joint washer, a limiting member, an interlock member, and two pins. The first joint washer has a first pivot hole and a first pin hole. The second joint washer is separate from and coplanar with the first joint washer. The second joint washer has a second pivot hole and a second pin hole. The limiting member has an accommodating slot recessed therein. The limiting member has a first annular hole and a second annular hole respectively arranged at two opposite outer sides of the accommodating slot. The interlock member is movably disposed in the accommodating slot of the limiting member. The interlock member has two elongated limiting holes, and a longitudinal direction of each of the two limiting holes is parallel to a first direction. The two pins are respectively inserted into the first pin hole and the second pin hole. The two pins respectively and movably pass through the two limiting holes. The first pivot passes through the first pivot hole of the first joint washer and the first annular hole of the limiting member. The at least one second pivot passes through the second pivot hole of the second joint washer and the second annular hole of the limiting member. When the first joint washer is rotated around the first pivot, one of the two pins inserted into the first pin hole moves the interlock member in a second direction perpendicular to the first direction, and the movement of the interlock member moves the other pin to rotate the second joint washer around the at least one second pivot. The at least one buffering module includes a fixing member fixed on the second joint washer, a moving member slidably disposed on the fixing member, and a driving mechanism fastened to the fixing member and the at least one second pivot. When the second joint washer is rotated around the at least one second pivot, the at least one second pivot is spun to drive the driving mechanism to move the moving member relative to the fixing member.

The present disclosure further discloses a hinge module, which includes at least one joint assembly, a first pivot, and at least one second pivot. The at least one joint assembly includes a first joint washer, a second joint washer, an interlock member, and two pins. The first joint washer has a first pivot hole and a first pin hole. The second joint washer is separate from and coplanar with the first joint washer. The second joint washer has a second pivot hole and a second pin hole. The interlock member has two elongated limiting holes. A longitudinal direction of each of the two limiting holes is parallel to a first direction. The two pins are respectively inserted into the first pin hole and the second pin hole. The two pins respectively and movably pass through the two limiting holes. The first pivot passes through the first pivot hole of the first joint washer. The at least one second pivot passes through the second pivot hole of the second joint washer. When the first joint washer is rotated around the first pivot, one of the two pins inserted into the first pin hole moves the interlock member in a second direction perpendicular to the first direction, and the movement of the interlock member moves the other pin to rotate the second joint washer around the at least one second pivot.

The present disclosure further discloses a joint assembly, which includes a first joint washer, a second joint washer, a limiting member, an interlock member, and two pins. The first joint washer has a first pivot hole and a first pin hole. The second joint washer is separate from and coplanar with the first joint washer. The second joint washer has a second pivot hole and a second pin hole. The limiting member has an accommodating slot recessed therein. The limiting member has a first annular hole and a second annular hole respectively arranged at two opposite outer sides of the accommodating slot. The interlock member is movably disposed in the accommodating slot of the limiting member. The interlock member has two elongated limiting holes, and a longitudinal direction of each of the two limiting holes is parallel to a first direction. The two pins are respectively inserted into the first pin hole and the second pin hole, and the two pins respectively and movably pass through the two limiting holes.

In summary, for each of the supporting device, the hinge module, and the joint assembly, the first and second joint washers are cooperated with the interlock member that is movable in a straight direction via the two pins, thereby achieving synchronized movement. Therefore, the hinge module can be formed without using the engaged sheet-like gears for easier production. Moreover, a distance between the first pivot and the second pivot can be easily adjusted by changing the size of the interlock member (e.g., using a larger or smaller interlock member).

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 12, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

Figure 1:
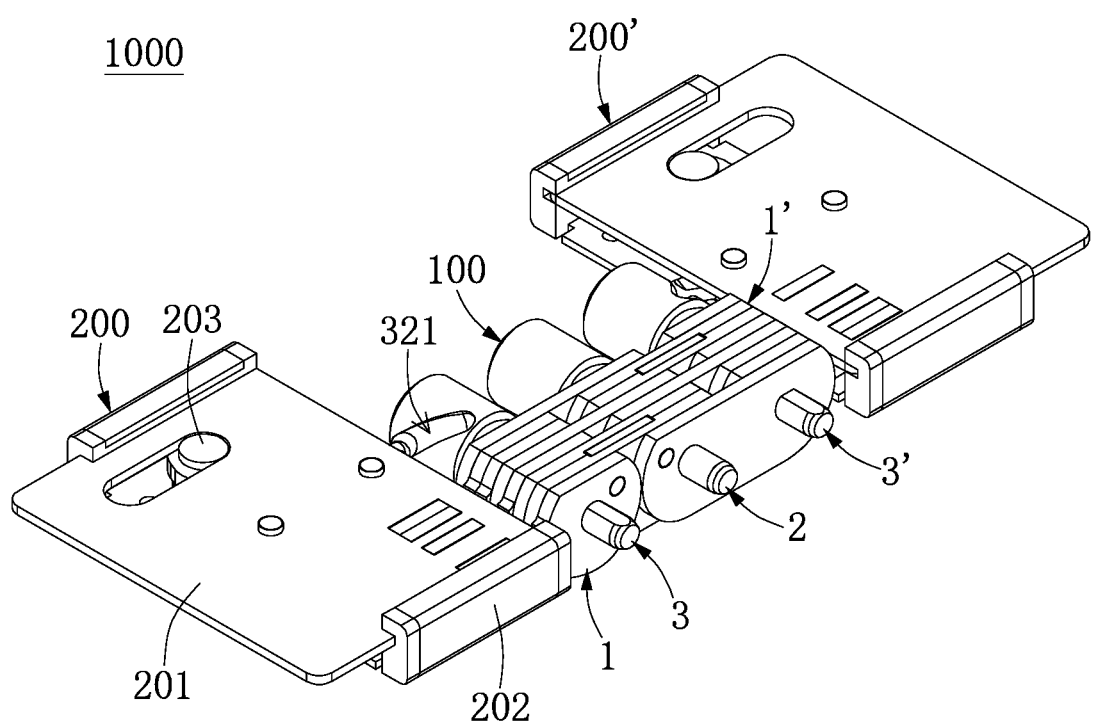
FIG. 1 is a perspective view showing a supporting device according to the present disclosure.
Figure 2:
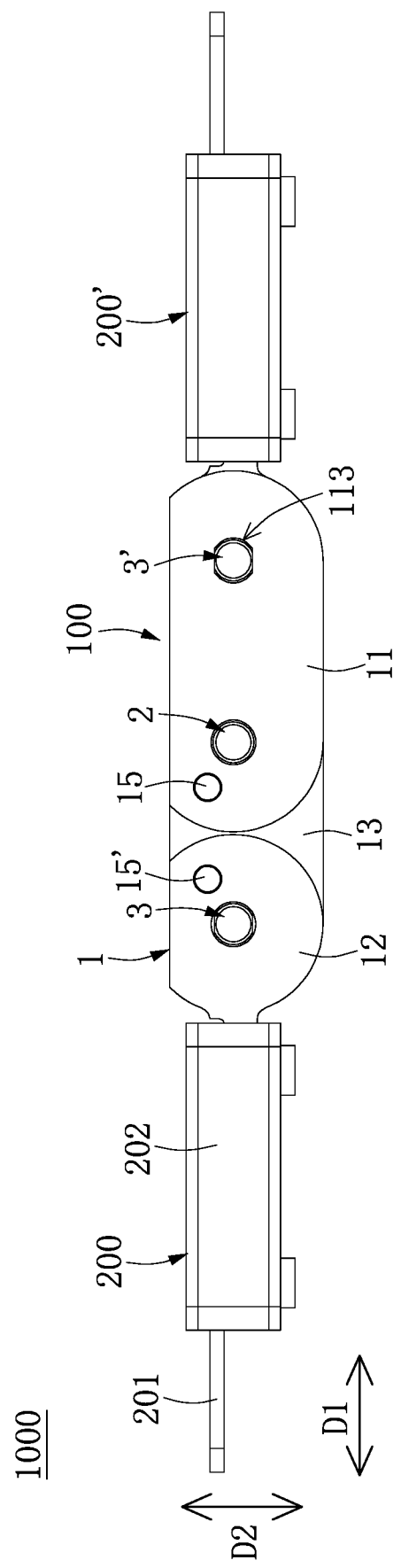
FIG. 2 is a schematic side view of FIG. 1.
Figure 3:
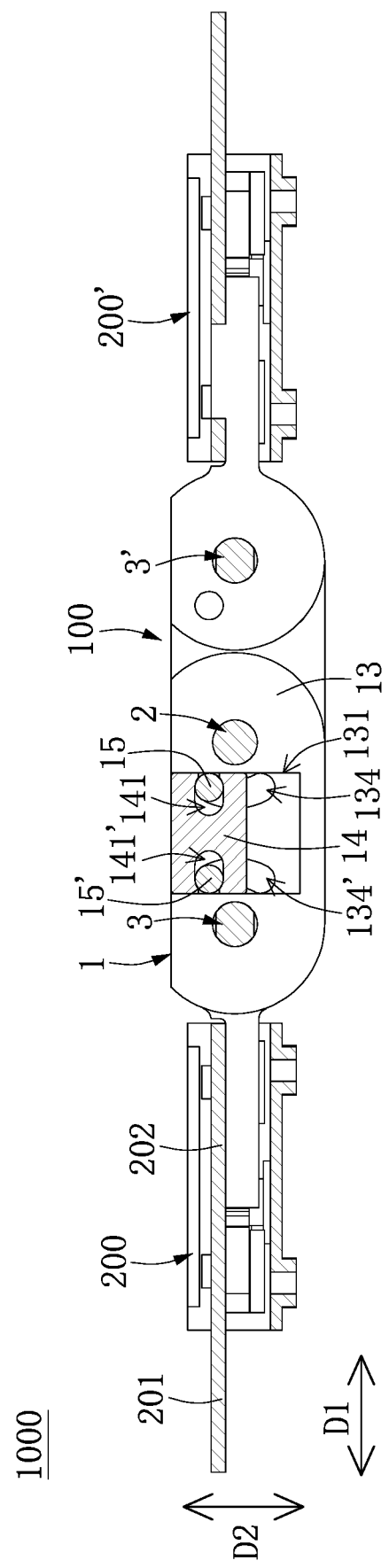
FIG. 3 is a cross-sectional view of FIG. 1.

As shown in FIGS. 1 to 3, the present embodiment discloses a supporting device 1000 used for supporting a bendable display, but the present disclosure is not limited thereto. The supporting device 1000 includes a hinge module 100 and two buffering modules 200 respectively connected to two opposite portions of the hinge module 100. Since the components of the supporting device 1000 move in relative motion, the figures depict only the fixed parts of the components (i.e., a limiting member 13) in order to clearly describe the instant disclosure. The following description discloses the structure and connection relationships of each component of the supporting device 1000.

Figure 4:
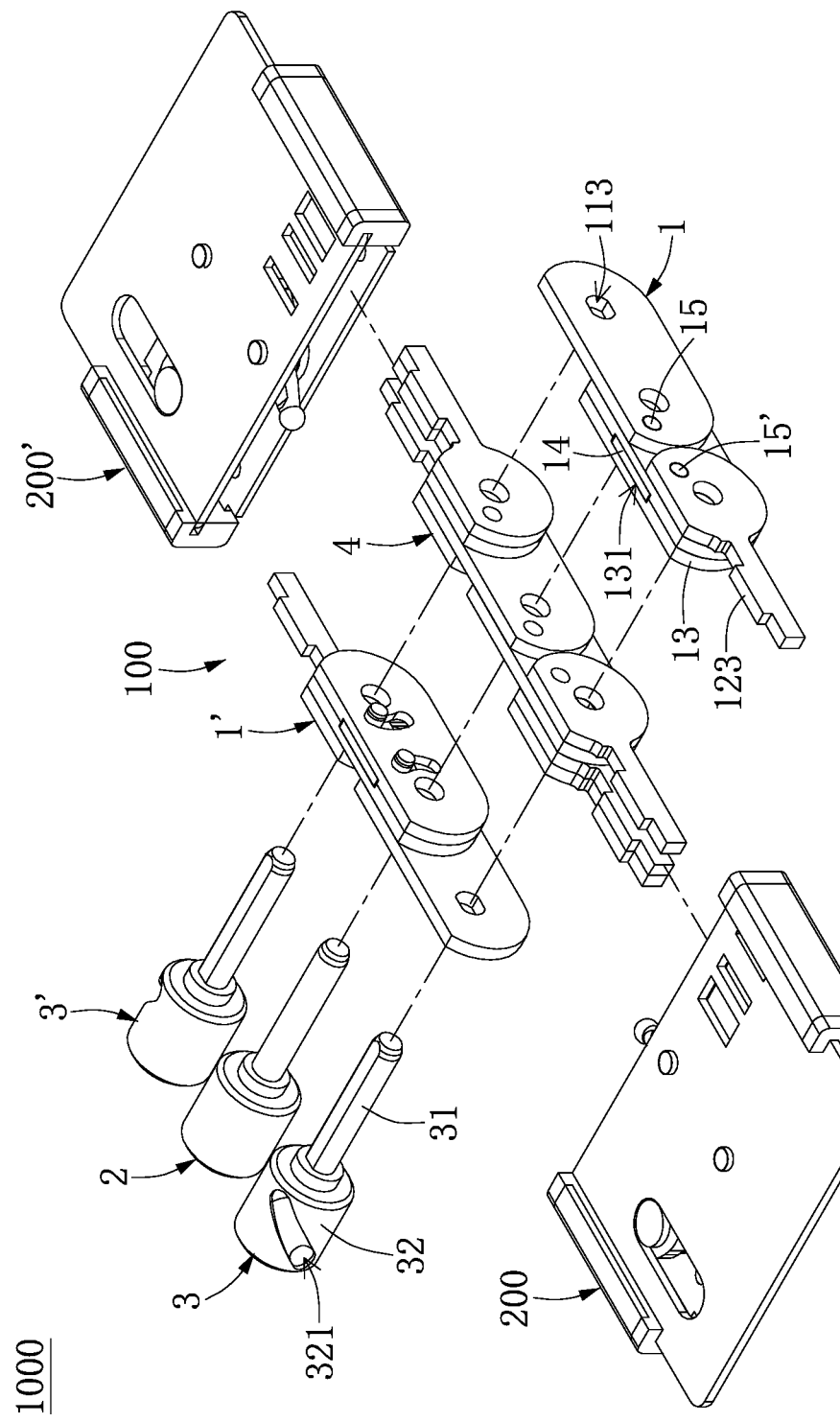
FIG. 4 is an exploded view of FIG. 1.
Figure 5:
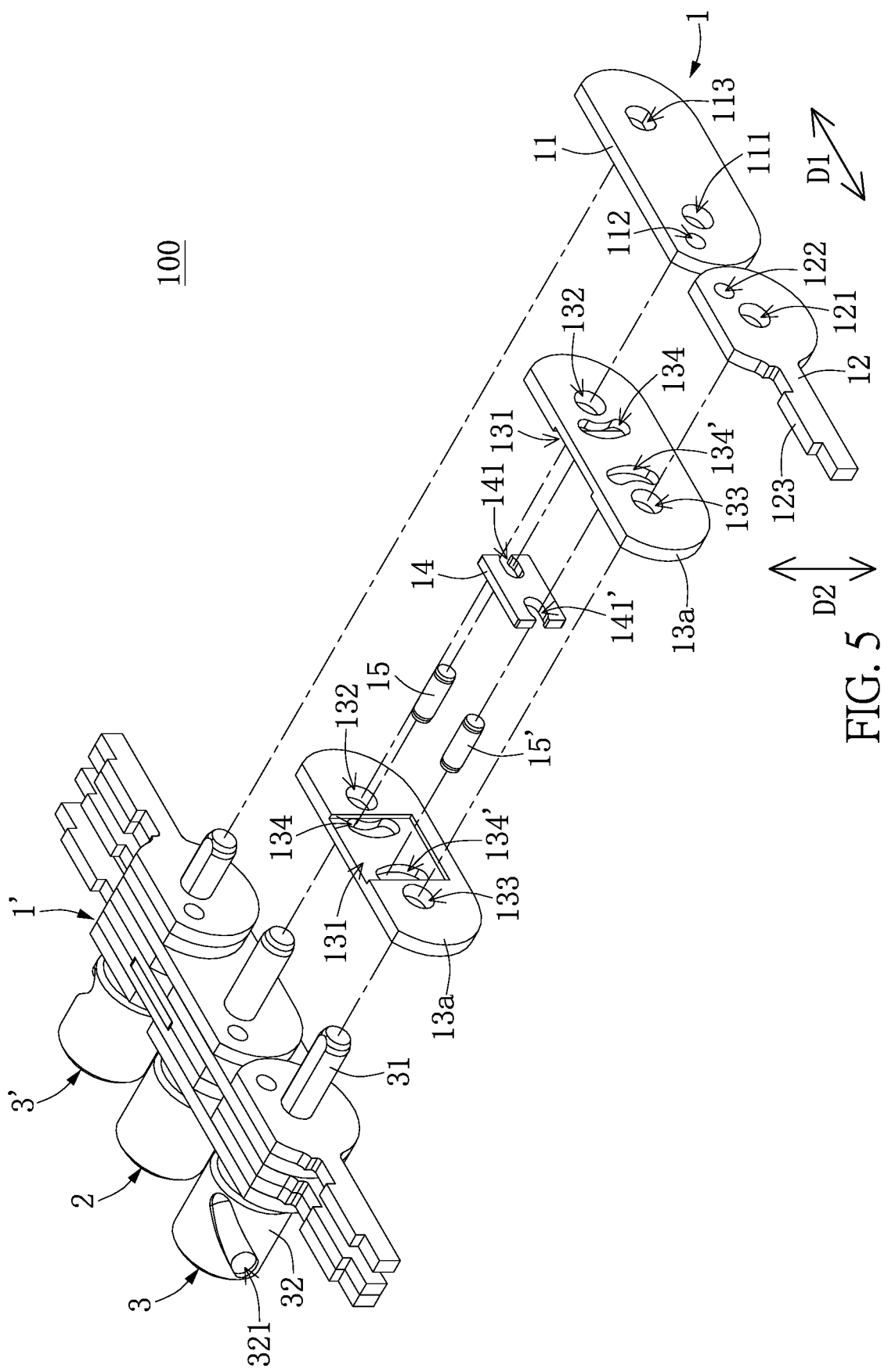
FIG. 5 is a partly exploded view of a hinge module of FIG. 1.

As shown in FIGS. 4 and 5, the hinge module 100 includes two joint assemblies 1, 1', a first pivot 2, and two second pivots 3, 3'. The two joint assemblies 1, 1' are sleeved around the first pivot 2 and are arranged in a 2-fold symmetry with respect to the first pivot 2, and the two second pivots 3, 3' are respectively inserted into and cooperated with the two joint assemblies 1, 1'. In addition, the hinge module 100 can be provided with a washer assembly 4 sandwiched between the two joint assemblies 1, 1' according to practical requirements, and the first pivot 2 and the two second pivots 3, 3' pass through the washer assembly 4.

Moreover, as the two joint assemblies 1, 1' are of the same structure, the following description discloses the structure of just one of the two joint assemblies 1, 1' and discloses the relationships of the joint assembly 1, the first pivot 2, and the corresponding second pivot 3 for the sake of brevity.

As shown in FIGS. 3 to 5, the joint assembly 1 includes a first joint washer 11, a second joint washer 12, a limiting member 13, an interlock member 14, and two pins 15, 15'. The second joint washer 12 is separate from and substantially coplanar with the first joint washer 11. The limiting member 13 is stacked on the first joint washer 11 and the second joint washer 12. The interlock member 14 is movably disposed in the limiting member 13. The two pins 15, 15' respectively pass through the first joint washer 11 and the second joint washer 12, and each of the two pins 15, 15' passes through the limiting member 13 and the interlock member 14.

In more detail, the first joint washer 11 has a circular first pivot hole 111, a circular first pin hole 112, and a non-circular fixing hole 113. The first pin hole 112 and the fixing hole 113 are respectively located at two opposite sides of the first pivot hole 111, and a distance between the first pivot hole 111 and the fixing hole 113 is larger than a distance between the first pivot hole 111 and the first pin hole 112.

The second joint washer 12 has a circular second pivot hole 121 and a circular second pin hole 122. The second joint washer 12 includes an engaging portion 123 arranged away from the second pin hole 122. The second pin hole 122 and the engaging portion 123 are respectively located at two opposite sides of the second pivot hole 121. The first pin hole 112 and the second pin hole 122 are arranged substantially between the first pivot hole 111 and the second pivot hole 121, and a distance between the first pivot hole 111 and the second pivot hole 121 is substantially equal to a distance between the first pivot hole 111 and the fixing hole 113.

The limiting member 13 includes two sheets 13a, each having a recess in the surface facing the other one of the sheets 13a to cooperatively define an accommodating slot 131. The limiting member 13 includes a first annular hole 132 and a second annular hole 133 respectively arranged at two opposite outer sides of the accommodating slot 131. Each of the first annular hole 132 and the second annular hole 133 passes through the two sheets 13a.

Moreover, the limiting member 13 has two arced grooves 134, 134' in spatial communication with the accommodating slot 131, and two centers of circle of the two arced grooves 134, 134' are respectively overlapped at a center of circle of the first annular hole 132 and a center of circle of the second annular hole 133. Each of the two arced grooves 134, 134' in the present embodiment passes through the two sheets 13a, but the present disclosure is not limited thereto. For example, in other embodiments of the present disclosure, the two arced grooves 134, 134' can be formed in one of the two sheets 13a, and the other sheet 13a can have two holes (not shown) respectively corresponding in position to and larger than the two arced grooves 134, 134'.

In addition, the limiting member 13 in the present embodiment is formed by assembling the two sheets 13a, but the present disclosure is not limited thereto. For example, in other embodiments of the present disclosure, the limiting member 13 can be a single sheet.

Specifically, the first annular hole 132 and the second annular hole 133 of the limiting member 13 are respectively flush with and in spatial communication with the first pivot hole 111 of the first joint washer 11 and the second pivot hole 121 of the second joint washer 12. The accommodating slot 131 of the limiting member 13 is in spatial communication with the first pin hole 112 of the first joint washer 11 and the second pin hole 122 of the second joint washer 12. The two arced grooves 134, 134' of the limiting member 13 are respectively in spatial communication with the first pin hole 112 of the first joint washer 11 and the second pin hole 122 of the second joint washer 12.

The interlock member 14 in the present embodiment is a substantial H-shaped sheet and is movably disposed in the accommodating slot 131 of the limiting member 13. The interlock member 14 has two elongated limiting holes 141, 141', and a longitudinal direction of each of the two limiting holes 141, 141' is parallel to a first direction D1. The interlock member 14 moves in the accommodating slot 141 in a second direction D2 perpendicular to the first direction D1. Specifically, the two limiting holes 141, 141' of the interlock member 14 are respectively in spatial communication with the first pin hole 112 of the first joint washer 11 and the second pin hole 122 of the second joint washer 12. Each of the two limiting holes 141, 141' has a depth in the first direction D1 larger than a diameter of the corresponding first pin hole 112 (or the second pin hole 122).

Each of the two pins 15, 15' is a cylindrical structure and has a cross-section substantially identical in shape to that of the first pin hole 112 (or that of the second pin hole 122). Moreover, the two pins 15, 15' are respectively inserted into the first pin hole 112 and the second pin hole 122. The two pins 15, 15' respectively pass through the two limiting holes 141, 141', and respectively and movably pass through the two arced grooves 134, 134'.

The first pivot 2 is a substantially cylindrical structure and has a cross-section substantially identical in shape to that of the first pivot hole 111 (or that of the first annular hole 132). Moreover, the first pivot 2 passes through the first pivot hole 111 of the first joint washer 11 and the first annular hole 132 of the limiting member 13.

The second pivot 3 includes an inserting segment 31 and a driving segment 32. The inserting segment 31 has a non-circular cross-section, and the driving segment 32 has a spiral groove 321 recessed in an outer surface thereof. The cross-section of the inserting segment 31 is substantially identical in shape to that of the fixing hole 113. Moreover, the inserting segment 31 of the second pivot 3 passes through the second pivot hole 121 of the second joint washer 12 and the second annular hole 133 of the limiting member 13.

Figure 7:
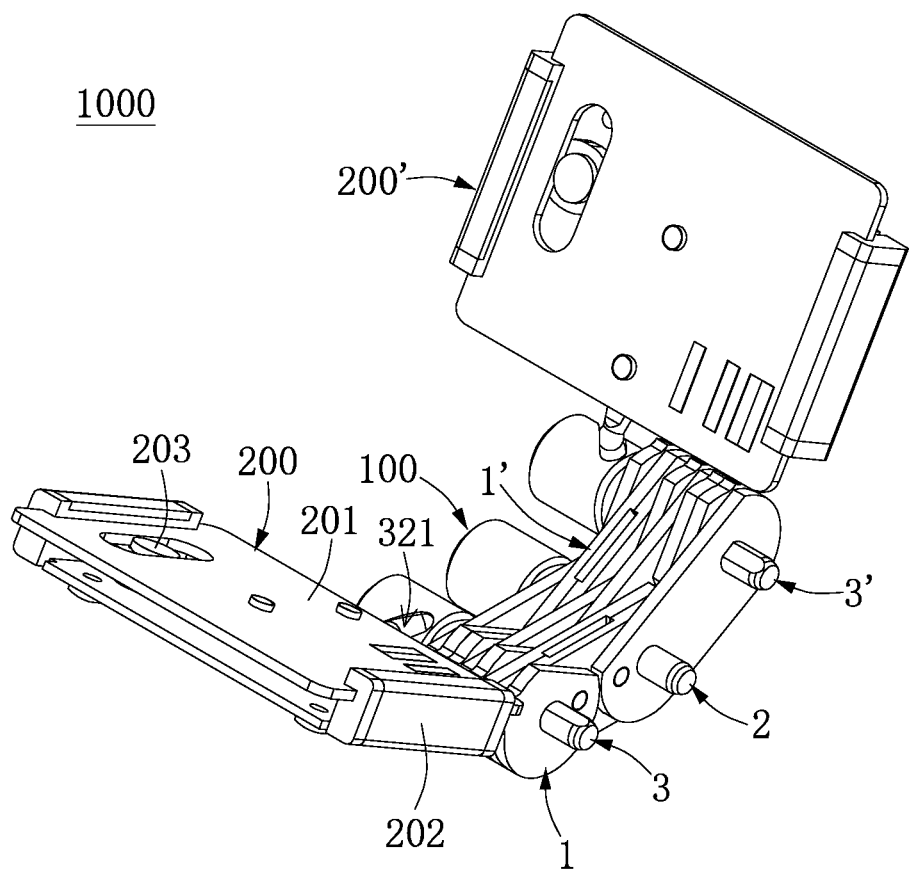
FIG. 7 is a perspective view of the supporting device according to the present disclosure when two buffering modules are rotated relative to each other for 90 degrees.
Figure 8:
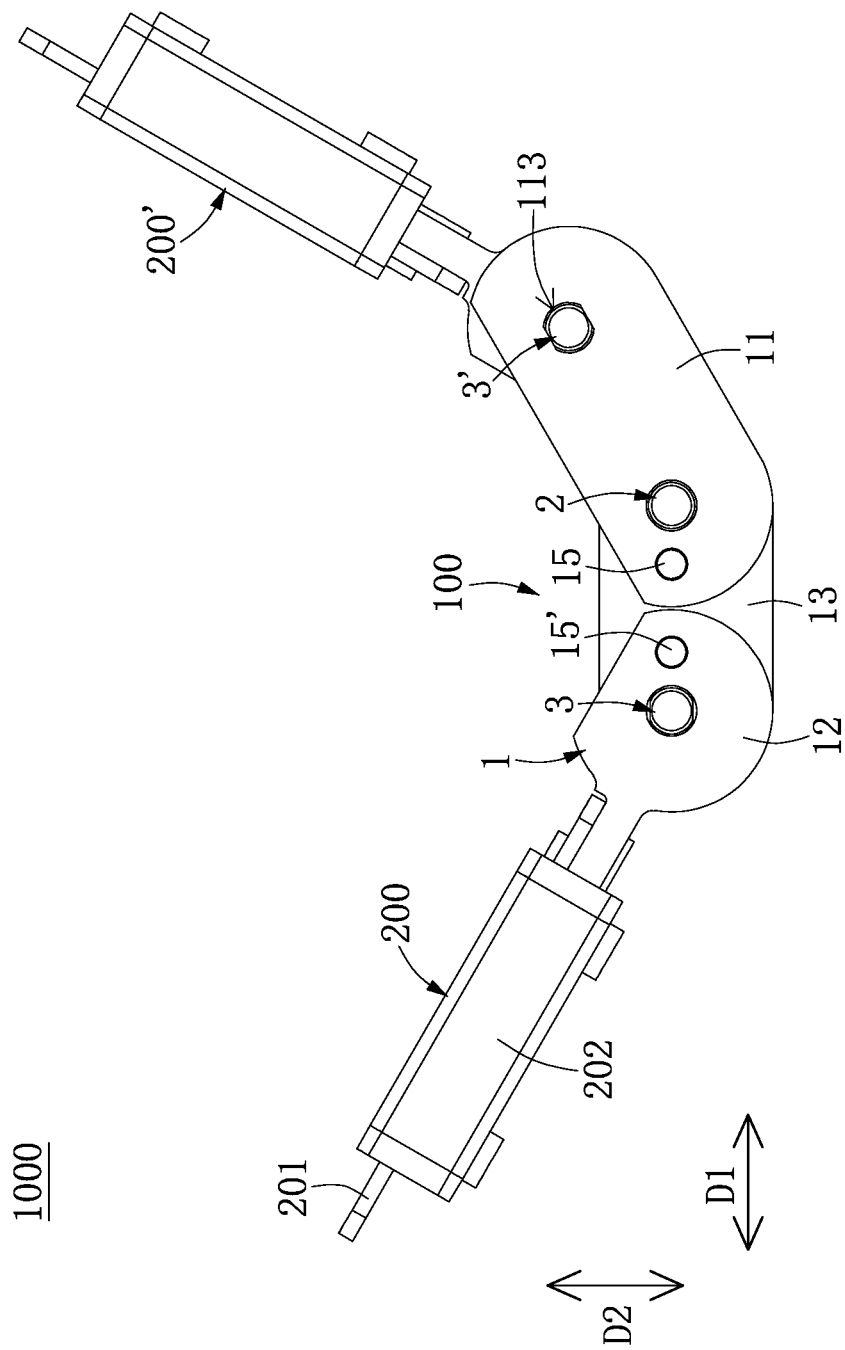
FIG. 8 is a schematic side view of FIG. 7.
Figure 9:
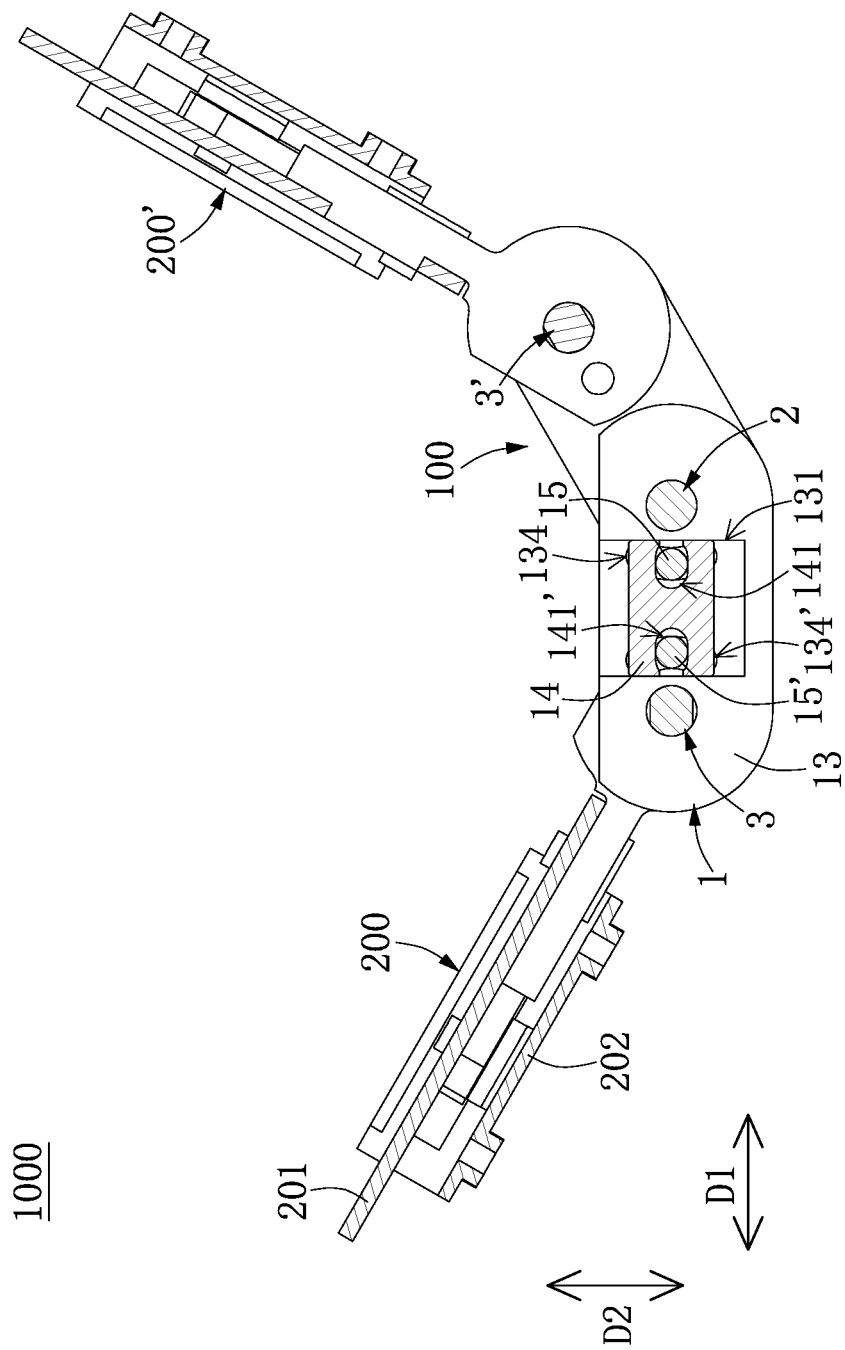
FIG. 9 is a cross-sectional view of FIG. 7.
Figure 10:
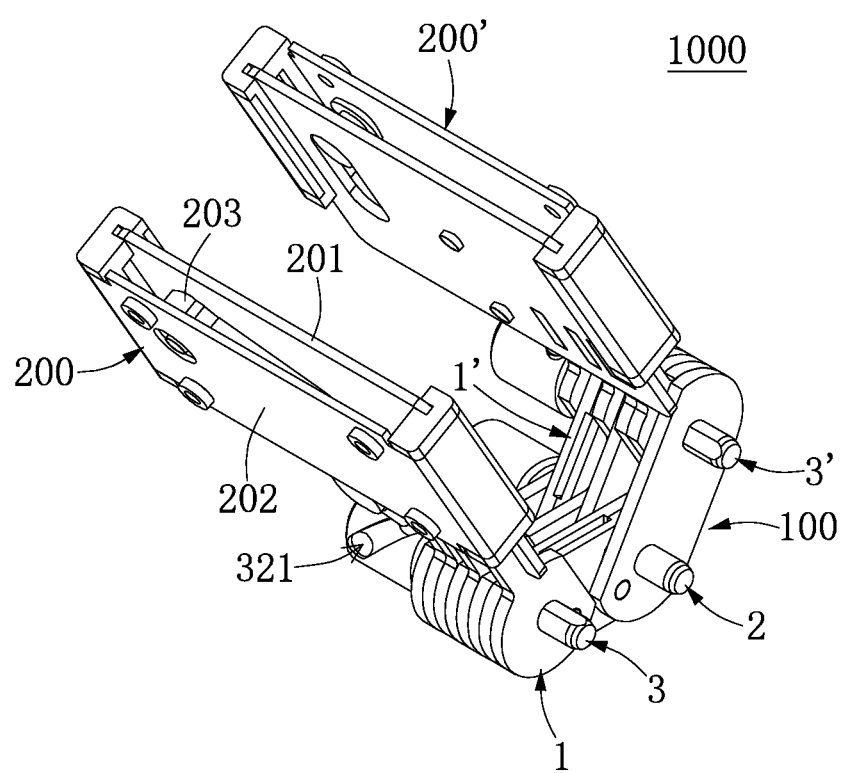
FIG. 10 is a perspective view showing the supporting device according to the present disclosure when the two buffering modules are rotated relative to each other for 180 degrees.
Figure 11:
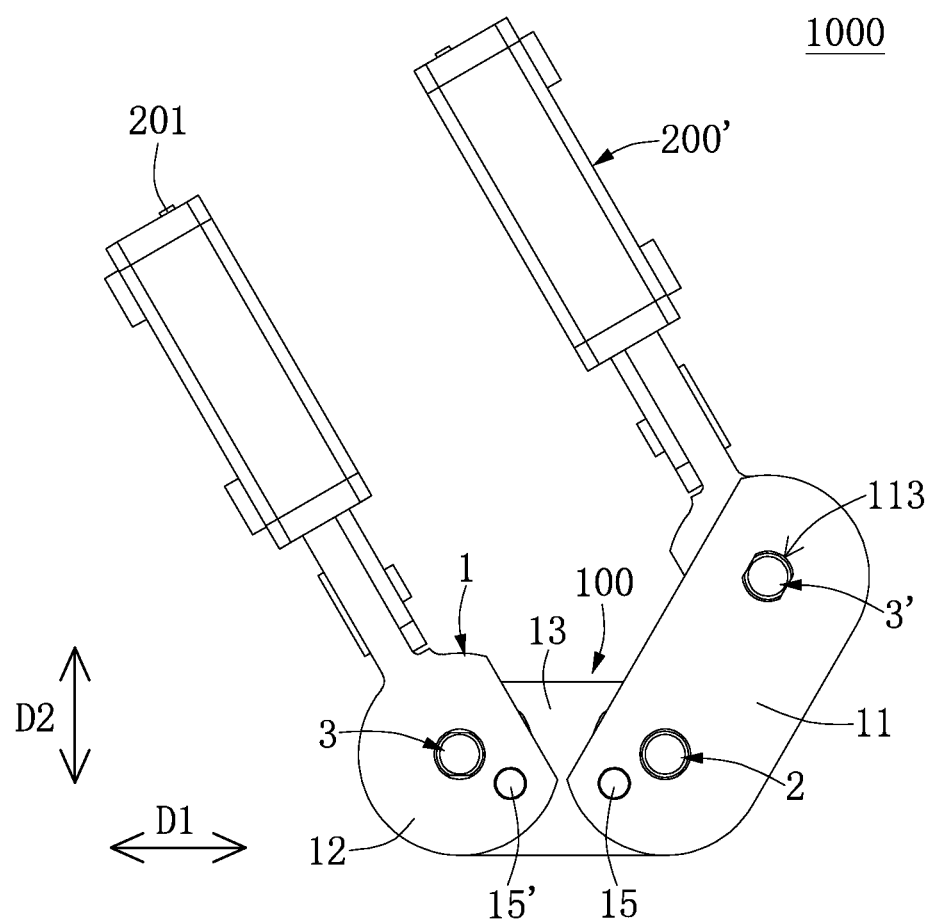
FIG. 11 is a schematic side view of FIG. 10.
Figure 12:
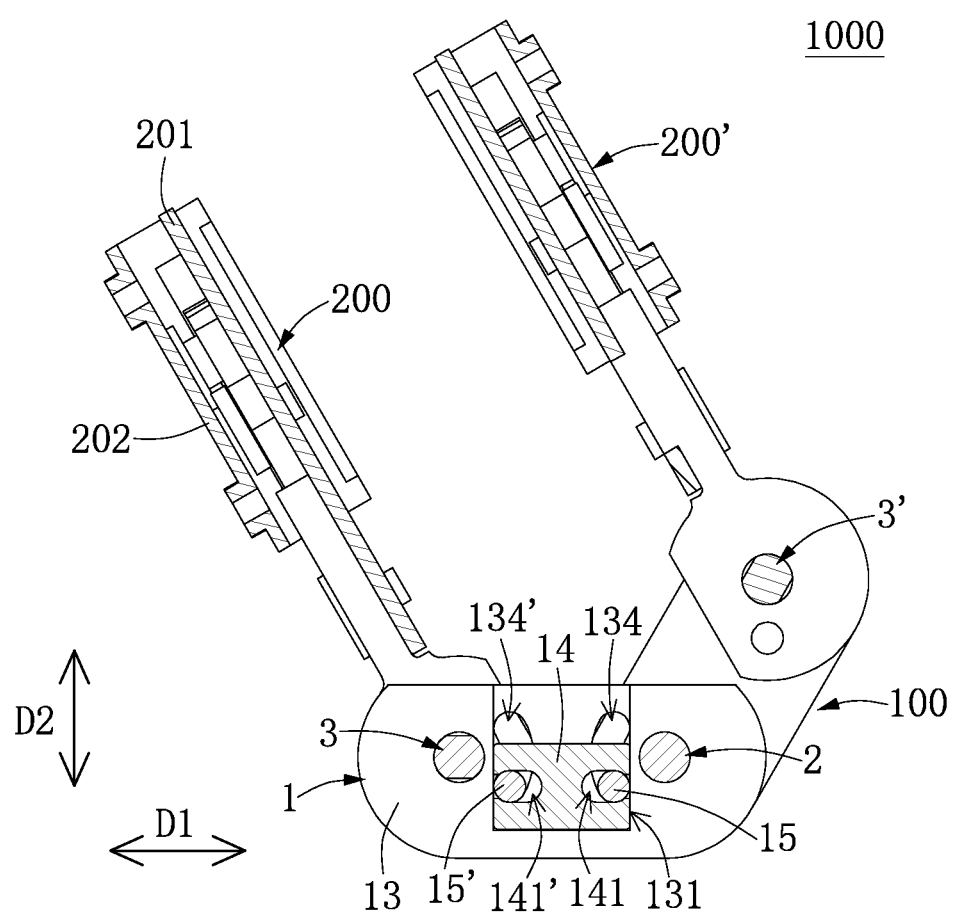
FIG. 12 is a cross-sectional view of FIG. 10.

In the joint assembly 1 and the cooperated first and second pivots 2, 3, when the first joint washer 11 is rotated around the first pivot 2, one of the two pins 15, 15' (i.e., the pin 15) inserted into the first pin hole 111 moves the interlock member 14 in the second direction D2, and the movement of the interlock member 14 moves the other pin 15' to rotate the second joint washer 12 around the second pivot 3. For example, the supporting device 1000 at a first position as shown in FIGS. 1 to 3 can be rotated to a second position as shown in FIGS. 7 to 9 (or a third position as shown in FIGS. 10 to 12).

In the hinge module 100, the first pivot 2 passes through the first pivot hole 111 of the first joint washer 11 of each of the two joint assemblies 1, 1' and the first annular hole 132 of the limiting member 13. That is to say, the two joint assemblies 1, 1' are sleeved around the first pivot 2. Moreover, the fixing hole 113 of the joint assembly 1 is sleeved around and fixed to the second pivot 3' cooperated with the other joint assembly 1'.

Figure 6:
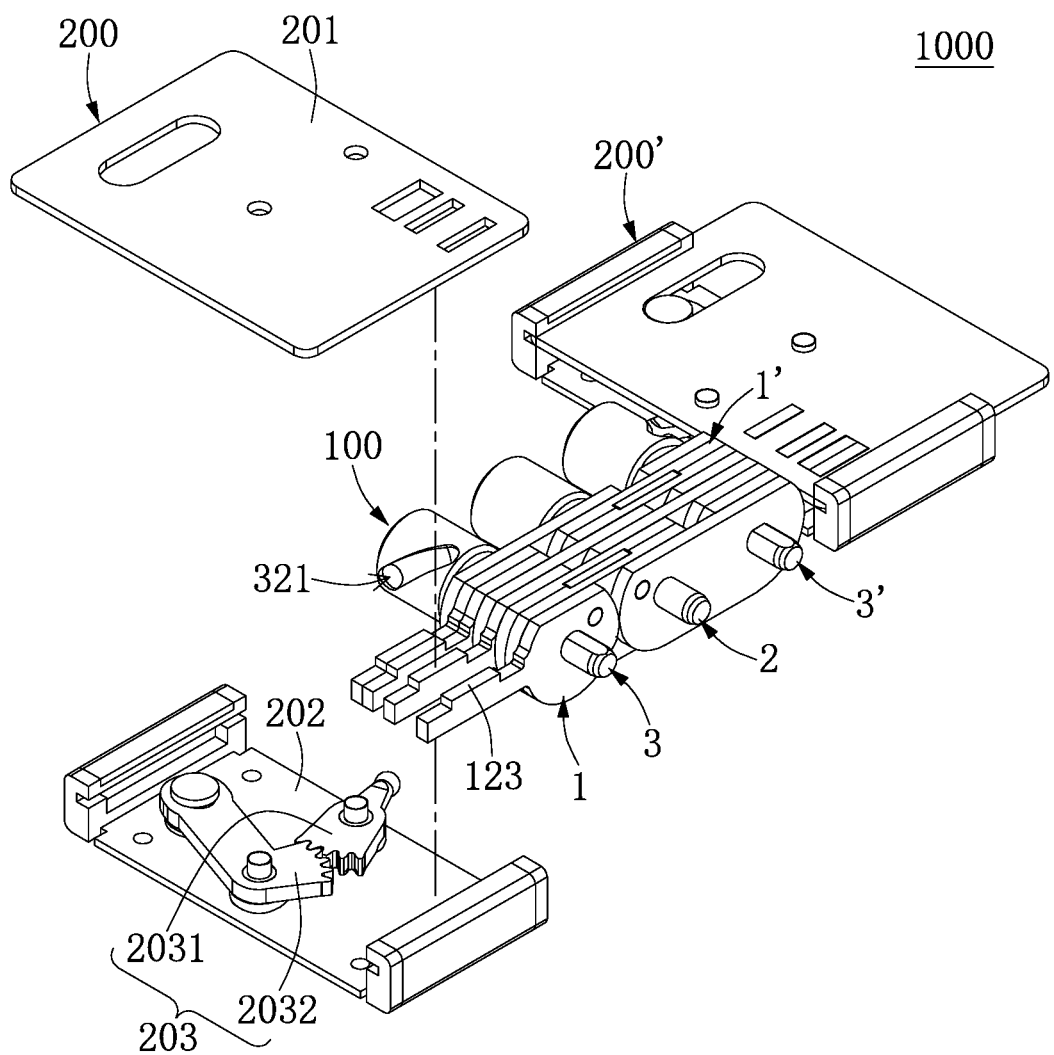
FIG. 6 is a partly exploded view of FIG. 1.

As shown in FIGS. 3, 4, and 6, as the two buffering modules 200, 200' are of the same or symmetrical structure, the following description only discloses the structure of one of the two buffering modules 200, 200' and the relationships of the buffering modules 200, the corresponding joint assembly 1, and the corresponding second pivot 3 for the sake of brevity.

The buffering module 200 includes a fixing member 201, a moving member 202, and a driving mechanism 203. The fixing member 201 is fixed to the second joint washer 12 of the joint assembly 1, the moving member 202 is slidably disposed on the fixing member 201, and the driving mechanism 203 is fastened to the fixing member 201 and the second pivot 3. When the second joint washer 12 is rotated around the second pivot 3, the second pivot 3 is spun to drive the driving mechanism 203 to move the moving member 202 relative to the fixing member 201. In the present disclosure, the term "spin" is used to refer to own-axis rotation.

Specifically, the fixing member 201 in the present embodiment is a plate and is engaged with the engaging portion 123 of the second joint washer 12, so that the fixing member 201 and the second joint washer 12 can be synchronously rotated. Two opposite portions of the moving member 202 are slidably cooperated with two opposite edges of the fixing member 201, so that the fixing member 201 and the moving member 202 can be synchronously rotated, and the moving member 202 can slide toward or away from the hinge module 100 relative to the fixing member 201.

Moreover, the driving mechanism 203 in the present embodiment is substantially arranged between the fixing member 201 and the moving member 202. The driving mechanism 203 includes a first connecting lever 2031 and a second connecting lever 2032. Each of the first connecting lever 2031 and the second connecting lever 2032 is pivotally connected to the fixing member 201, so that each of the first connecting lever 2031 and the second connecting lever 2032 is spinable relative to the fixing member 201. An end of the first connecting lever 2031 is engaged with an end of the second connecting lever 2032, the other end of the first connecting lever 2031 is movably inserted into the spiral groove 321 of the second pivot 3, and the other end of the second connecting lever 2032 is fixed on the moving member 202. Accordingly, when the second pivot 3 is spun, the spiral groove 321 drives the first and second connecting levers 2032, 2032 to move the moving member 202 relative to the fixing member 201, and the moving member 202 slides toward or away from the hinge module 100.

In other words, in the supporting device 1000, the fixing members 201 of the two buffering modules 200 are respectively fastened to the engaging portions 123 of the second joint washer 12 of the two joint assemblies 1, 1', and the driving mechanisms 203 of the two buffering modules 200 are respectively installed to the spiral grooves 321 of the two second pivots 3, 3'. Therefore, when the supporting device 1000 is bent, the hinge module 100 and the two buffering modules 200, 200' are can operate in synchronization.

In addition, the supporting device 1000 of the present embodiment is provided with three pivots (i.e., the first pivot 2 and the two second pivots 3, 3'), but the number of the pivots of the supporting device 1000 can be adjusted by increasing or decreasing the number of the joint assemblies 1, 1' of the hinge module 100.

Moreover, the hinge module 100 or the joint assembly 1, 1' in the present embodiment is applied to the supporting device 1000, but the present disclosure is not limited thereto. For example, in other embodiments of the present disclosure, the hinge module 100 or the joint assembly 1, 1' can be applied to other devices.

[The Effects Associated with the Present Embodiments]

In summary, for the supporting device 1000, the hinge module 100, or the joint assembly 1, the first and second joint washers 11, 12 are cooperated with the interlock member 14 being movable in a straight direction by using the two pins 15, 15', thereby achieving a synchronized movement. Thus, the hinge module 100 can be formed without using the engaged sheet-like gears for easier production. Moreover, a distance between the first pivot 2 and the second pivot 3 can be easily adjusted by changing the size of the interlock member 14 (e.g., using a bigger or smaller interlock member 14).

In addition, the joint assembly 1 can adapt the limiting member 13 to define the moving path of the interlock member 14, so that the operation of the supporting device 1000 (or the hinge module 100) can be smoother. The number of the pivots of the supporting device 1000 can be adjusted by increasing or decreasing the number of the joint assemblies 1, 1' of the hinge module 100, thereby satisfying different design requirements.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A supporting device, comprising:
    a hinge module including:
        at least one joint assembly including:
            a first joint washer having a first pivot hole and a first pin hole;
            a second joint washer separate from and coplanar with the first joint washer, wherein the second joint washer has a second pivot hole and a second pin hole;
            a limiting member having an accommodating slot recessed therein, wherein the limiting member has a first annular hole and a second annular hole respectively arranged at two opposite outer sides of the accommodating slot;
            an interlock member having two elongated limiting holes, wherein a longitudinal direction of each of the two limiting holes is parallel to a first direction, and the interlock member is movably disposed in the accommodating slot of the limiting member so as to be movable relative to the accommodating slot along a straight direction perpendicular to the first direction, and wherein the accommodating slot has a width and a depth, the interlock member has a width and a depth that is shorter than the depth of the accommodating slot, so that the movement of the interlock member is only along the depth of the accommodating slot; and
            two pins respectively inserted into the first pin hole and the second pin hole, wherein the two pins respectively and movably pass through the two limiting holes;
        a first pivot passing through the first pivot hole of the first joint washer and the first annular hole of the limiting member; and
        at least one second pivot passing through the second pivot hole of the second joint washer and the second annular hole of the limiting member;
        wherein when the first joint washer is rotated around the first pivot, one of the two pins inserted into the first pin hole moves the interlock member along the accommodating slot and the movement of the interlock member moves the other pin to rotate the second joint washer around the at least one second pivot; and
    at least one buffering module including:
        a fixing member fixed on the second joint washer;
        a moving member slidably disposed on the fixing member; and
        a driving mechanism fastened to the fixing member and the at least one second pivot, wherein when the second joint washer is rotated around the at least one second pivot, the at least one second pivot is spun to drive the driving mechanism to move the moving member relative to the fixing member.

2. The supporting device as claimed in claim 1, wherein the limiting member has two arced grooves that are curved around the first and second annular holes, and the two pins respectively pass through the two arced grooves.

3. The supporting device as claimed in claim 1, wherein the at least one joint assembly's number of the hinge module is two, and the two joint assemblies are sleeved around the first pivot; the number of the at least one second pivot of the hinge module is two, and the two second pivots are respectively inserted into and cooperated with the two joint assemblies; and the first joint washer of each of the two joint assemblies has a non-circular fixing hole sleeved around and fixed to the second pivot cooperated with the other joint assembly.

4. The supporting device as claimed in claim 3, wherein the number of the at least one buffering module is two, the fixing members of the two buffering modules are respectively fastened to the second joint washers of the two joint assemblies, and the driving mechanisms of the two buffering modules are respectively fastened to the two second pivots.

5. A hinge module, comprising:
    at least one joint assembly including:
        a first joint washer having a first pivot hole and a first pin hole;
        a second joint washer separate from and coplanar with the first joint washer, wherein the second joint washer has a second pivot hole and a second pin hole;
        a limiting member having an accommodating slot recessed therein wherein the limiting member has a first annular hole and a second annular hole respectively arranged at two opposite outer sides of the accommodating slot,
        an interlock member having two elongated limiting holes, wherein a longitudinal direction of each of the two limiting holes is parallel to a first direction, and the interlock member is movably disposed in the accommodating slot so as to be movable relative to the accommodating slot along a straight direction perpendicular to the first direction, and wherein the accommodating slot has a width and a depth, the interlock member has a width and a depth that is shorter than the depth of the accommodating slot, so that the movement of the interlock member is only along the depth of the accommodating slot; and
        two pins respectively inserted into the first pin hole and the second pin hole, wherein the two pins respectively and movably pass through the two limiting holes;

a first pivot passing through the first pivot hole of the first joint washer and the first annular hole of the limiting member; and at least one second pivot passing through the second pivot hole of the second joint washer and the second annular hole of the limiting member;

wherein when the first joint washer is rotated around the first pivot, one of the two pins inserted into the first pin hole moves the interlock member along the accommodating slot, and the movement of the interlock member moves the other pin to rotate the second joint washer around the at least one second pivot.

6. The hinge module as claimed in claim 5, wherein the limiting member has two arced grooves that are curved around the first and second annular holes, and the two pins respectively pass through the two arced grooves.

7. The hinge module as claimed in claim 5, wherein the number of the at least one joint assembly is two, and the two joint assemblies are sleeved around the first pivot; the at least one second pivot's number is two, and the two second pivots are respectively inserted into and cooperated with the two joint assemblies; and the first joint washer of each of the two joint assemblies has a non-circular fixing hole sleeved around and fixed to the second pivot cooperated with the other joint assembly.

8. A joint assembly, comprising:

a first joint washer having a first pivot hole and a first pin hole;

a second joint washer separate from and coplanar with the first joint washer, wherein the second joint washer has a second pivot hole and a second pin hole;

a limiting member having an accommodating slot recessed therein, wherein the limiting member has a first annular hole and a second annular hole respectively arranged at two opposite outer sides of the accommodating slot;

an interlock member having two elongated limiting holes, and a longitudinal direction of each of the two limiting holes is parallel to a first direction, and the interlock member is movably disposed in the accommodating slot of the limiting member so as to be movable relative to the accommodating slot along a straight direction perpendicular to the first direction, and wherein the accommodating slot has a width and a depth, the interlock member has a width and a depth that is shorter than the depth of the accommodating slot, so that the movement of the interlock member is only along the depth of the accommodating slot; and two pins respectively inserted into the first pin hole and the second pin hole, wherein the two pins respectively and movably pass through the two limiting holes.

9. The joint assembly as claimed in claim 8, wherein the limiting member has two arced grooves that are curved around the first and second annular holes, and the two pins respectively pass through the two arced grooves.

* * * * *